United States Patent [19]
Choi et al.

[11] Patent Number: 6,084,656
[45] Date of Patent: Jul. 4, 2000

[54] PROGRAMMABLE MASK FOR EXPOSURE APPARATUS

[75] Inventors: Chang Auck Choi; Jong Hyun Lee; Won Ick Jang; Yong Il Lee; Jong Tae Baek; Bo Woo Kim, all of Daejon-Shi, Rep. of Korea

[73] Assignee: Electronics and Telecommunications Research Institute, Daejon-Shi, Rep. of Korea

[21] Appl. No.: 09/141,554

[22] Filed: Aug. 28, 1998

[30] Foreign Application Priority Data

Dec. 2, 1997 [KR] Rep. of Korea ...................... 97-65335

[51] Int. Cl.[7] .......................... G03B 27/72; G03B 27/42; G03F 9/00
[52] U.S. Cl. ..................... 355/71; 355/53; 430/5
[58] Field of Search .................... 430/5, 20, 22; 355/53, 71, 67, 72, 74, 75; 359/2, 4, 5

[56] References Cited

U.S. PATENT DOCUMENTS

| | | | |
|---|---|---|---|
| 3,716,296 | 2/1973 | Springer et al. | 355/53 |
| 3,873,824 | 3/1975 | Bean et al. | 250/505 |
| 4,408,875 | 10/1983 | Majima | 355/53 |
| 4,653,860 | 3/1987 | Hendrix | 350/336 |
| 4,843,587 | 6/1989 | Schlunt et al. | 364/841 |
| 5,742,362 | 4/1998 | Chikamichi | 349/2 |
| 5,757,536 | 5/1998 | Ricco et al. | 359/224 |
| 5,870,176 | 2/1999 | Sweat et al. | 355/53 |

OTHER PUBLICATIONS

Peter D. Buck, "A 0.5 Micron Optical Mask Process for 364 nm Scanned Laser Lithography", SPIE vol. 1264 Optical/Laser Microlithography III (1990), pp. 158–166.

Shigehisa Ohki et al., "High–Precision X–Ray Mask Technology", JJAP Series 4, Proc. Of 1990 Intern, MicroProcess Conference, pp. 68–72.

Jen–Yu Yew et al., "Mix–and–match lithography processes for 0.1 μm MOS transistor device fabrication", SPIE vol. 2723, pp. 180–188.

*Primary Examiner*—Safet Metjahic
*Assistant Examiner*—Hung Henry Nguyen
*Attorney, Agent, or Firm*—Jacobson, Price, Holman & Stern, PLLC

[57] ABSTRACT

This invention discloses a programmable mask for exposure apparatus which is formed by an integrated pixels of a micro-devices which shut or open a light by an electrical signal. This invention provides a photolithography method by projecting on a silicon wafer a directly designed circuit pattern which is made on a programmable mask fabricated by an integration of many a micro optical shutter devices as a pixels.

1 Claim, 2 Drawing Sheets

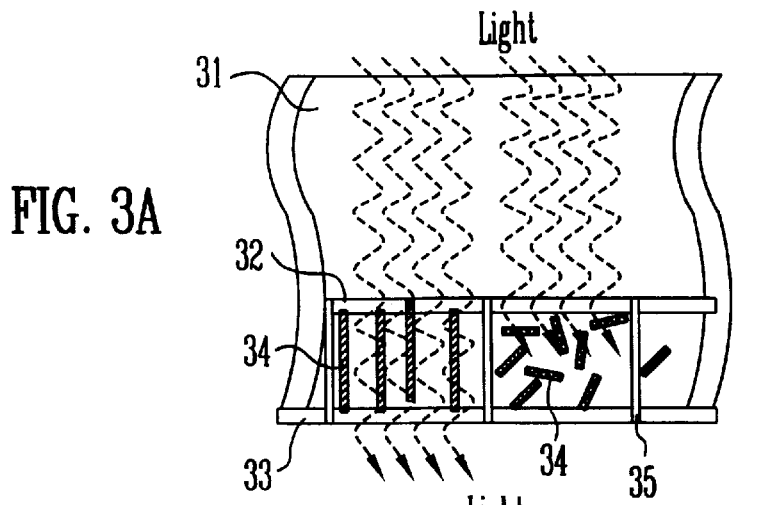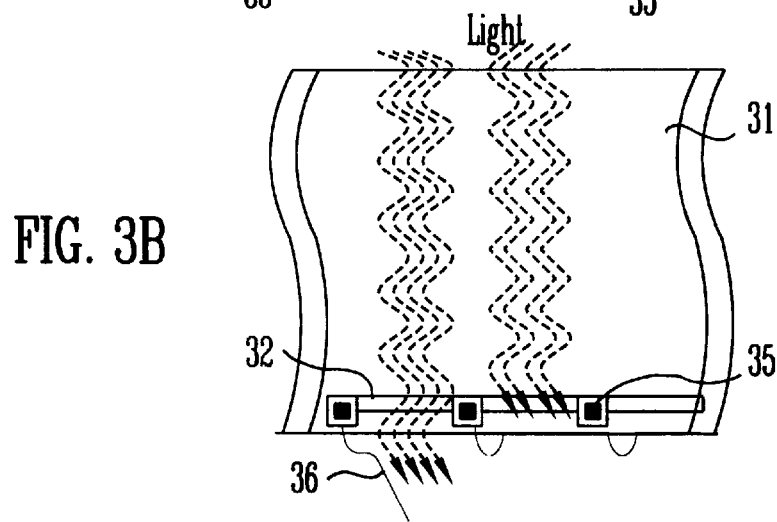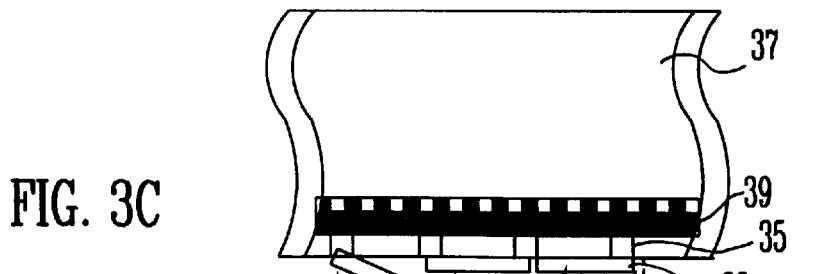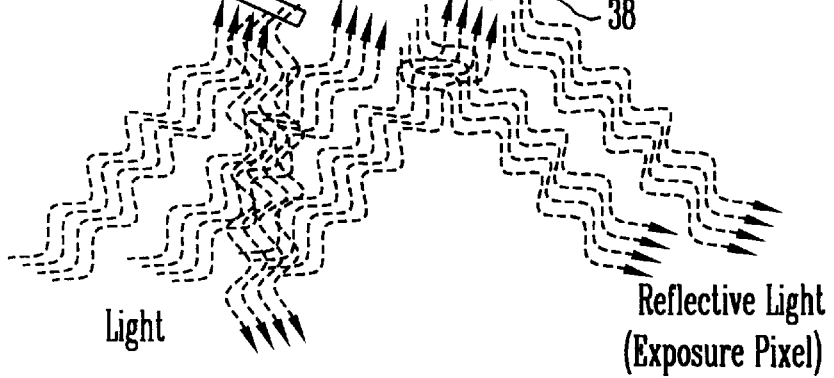
FIG. 3A
FIG. 3B
FIG. 3C

PROGRAMMABLE MASK FOR EXPOSURE APPARATUS

BACKGROUND OF THE INVENTION

1. Field of the Invention

This invention relates to a programmable mask for exposure apparatus and, more particularly to a pattern exposure mask which is formed by an integrated pixels of a micro-devices which shut or open a light by an electrical signal.

2. Description of the Related Art

There are several different kind of methods for pattering a micro pattern such as semiconductor integrated circuits on a semiconductor wafer such as an e-beam lithography method drawing the patterns directly by injecting an electron beam on the semiconductor wafer coated with a photoresist and a projection method, an indirect method, projecting the patterns printed by 5 or 10 times bigger than a real size on a mask by using an exposure apparatus projecting the patterns repeatedly by reducing the size optically to ⅕ or ¹/₁₀ of the original pattern size on the semiconductor wafer coated with photoresist.

Generally, the projection method needs many masks for fabricating a semiconductor devices and the mask is fabricated by printing a circuit pattern with a metal film such as a chromium so that it blockade light on a projection quartz substrate.

The e-beam lithography apparatus drawing the patterns directly does not need the masks and has higher resolution than the projection type exposure such as a stepper, but it also has an disadvantage of application to a mass-production processing. Therefore, until now, the stepper, one of the reduced projection type exposure apparatus using optical system, has been used in many mass-production processing lines. But, for using the projection type exposure, there are still many problems needed to be solved such as a technical problems and cost-up problems. The technical problems to be solved are as an errors between the masks as much as the number of the masks, an errors caused by a stacking of the overlapping patterns, and an errors caused by the alignment of the masks and also the cost-up problems are a fabrication and control of the expensive masks for each processing steps.

SUMMARY OF THE INVENTION

The object of this invention is to provides a programmable mask which can read and erase an information of a circuit patterns on the programmable mask installed in an exposure apparatus for achieve a lithography process without a masks spending much time and money for fabrication of every each processing steps.

In order to achieve the object, the programmable mask according to this invention for an exposure apparatus includes an exposing pattern formed by an array structure of unit micro-device which has an optical shutter or optical reflector function activated by a electrical pattern information on a mask plate for exposure and can apply light which can expose a photoresist according to an electrical input signal.

BRIEF DESCRIPTION OF THE DRAWINGS

The invention is best understood from the following detailed description when read in conjunction with the accompanying drawings, in which:

FIG. 3a through 3c are a cross sectional views of an optical shutter device and a driving device integrated in a programmable mask.

Similar reference characters refer to similar parts in the several views of the drawings.

DETAILED DESCRIPTION OF THE INVENTION

The present invention will be described below with reference to the accompanying drawings.

Figure 1:
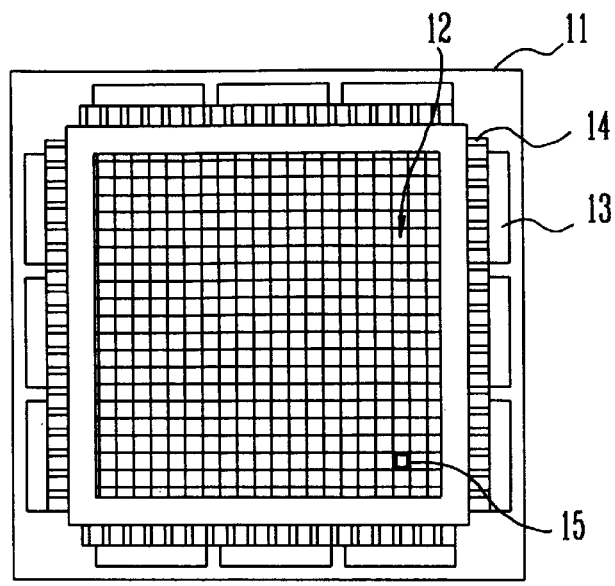
FIG. 1 is a schematic diagram of a programmable mask.

FIG. 1 is a schematic diagram of a programmable mask. A micro optical shutter devices or an optical reflecting plate driving devices 15 are placed on a quartz or a semiconductor substrate 12 by using semiconductor fabrication processing. The programmable mask includes a supporting board 11 for supporting a quartz or semiconductor substrate 12, a several integrated circuit 13, placed outside of the substrate, for switching on/off an optical shutter devices by inputting a pattern information, and an interface unit 14 connecting electrically the quartz substrate and each integrated circuit 13. An unit optical shutter devices or an optical reflecting plate driving devices 15 are places as an array type on the substrate 12. The programmable mask, as explained above, includes the array of the unit devices such as the micro optical shutter or optical reflecting plate driving devices which can open or close light by every each devices drived by an electrical signal so that the mask pattern is patterned on the programmable mask by opening or closing each of an exposure pixels of the unit optical devices.

Figure 2A:
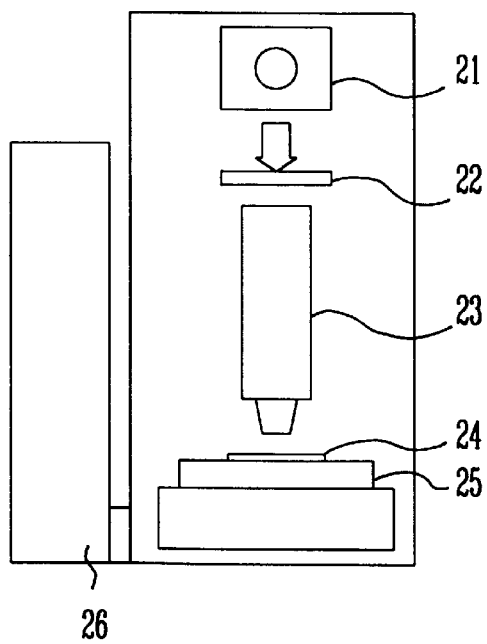
FIG. 2a and 2b are schematic diagram of an exposure apparatus.
Figure 2B:
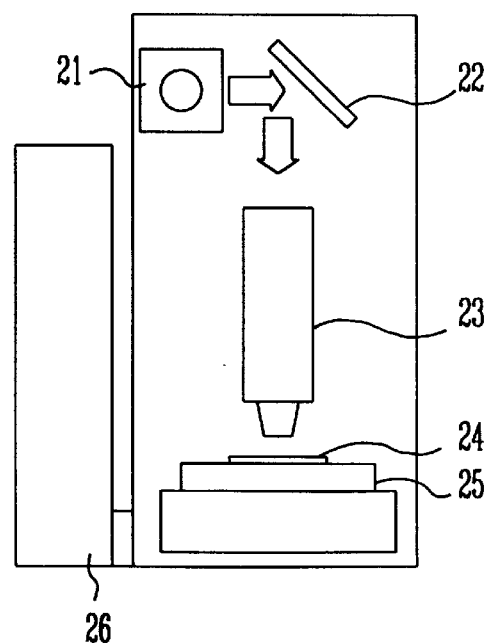

FIGS. 2a and 2b are schematic diagram of an exposure apparatus. FIG. 2a is a schematic diagram of an optical projection stepper system when the programmable mask using the optical shutter devices is used, and FIG. 2b is a schematic diagram of optical reflection stepper system when the programmable mask using the optical reflecting plate driving devices used. As shown in FIG. 2a, the optical projection stepper includes an optical source unit 21, the programmable mask fabricated by the optical shutter devices 22, an optical main body 23 which can reduce an images to ⅕ or ¹/₁₀ optically, a printed substrate 24 to be projected a pattern, a driving stage unit 25 drived by a unit repeatedly, and a control unit 26 which inputs a pattern information designed to the mask and operates the exposure apparatus. The optical reflection stepper, as shown in FIG. 2b, is almost the same structure shown in FIG. 2a and includes the programmable mask fabricated by using the optical reflecting plate driving devices instead of using the optical shutter devices so that the light source is to be reflected by the programmable mask 22.

FIGS. 3a through 3c are a cross sectional views of the optical shutter device and the driving device integrated in the programmable mask. FIGS. 3a and 3b are a cross sectional views of the optical shutter devices integrated in the optical projection programmable mask and FIG. 3c is a cross sectional views of the optical reflecting plate driving devices integrated in the optical reflection programmable mask.

At first, FIG. 3a is a cross sectional view of the optical shutter device which is operated by electrical polarization materials or derivative materials 34 filled in a device separation block 35 area between a top transparent electrode 32 and a bottom transparent electrode 33, which are fabricated on one side of the projection quartz substrate 31, due to an electrostatic force or electrical polarity between the two electrodes.

FIG. 3b is a cross sectional view of the optical shutter device which is operated by an actuator type pixel, which is fabricated between the top transparent electrode 32 and bottom opaque electrode 36 on one side of the projection quartz substrate 31 as same as in FIG. 3a, driven by an electrical signal applied to the electrode.

In FIG. 3c, the bottom electrode of the two electrodes in FIGS. 3a and 3b is substituted by a driving reflection plate 38. FIG. 3c is a cross sectional view of the optical reflecting plate driving device which can control a reflective light path from an input light with every unit exposure pixel by driving the driving reflection plate 38 drived by an electrostatic force or by using a contraction and expansion force caused by thermoelectric effect of the reflection plate 38 made by a bi-metal or a shape memory alloy metal. In this structure, pixel control circuit 39 can be embedded on non-transparent substrate 37 such as silicon substrate.

Different from the conventional quartz mask, the programmable mask which can create and erase a circuit patterns on the mask is using a method to switch on/off a projected light from an input light by a unit pixel. There are two different kind of methods to switch on/off the unit pixel of the programmable mask. One is a method to transmit light or not through an alignment of the magnetic alignment material or polarization between two electrodes of the unit device according to an electric field applied between the electrodes. The other method is to open or close an actuator plate of the non-projection electrode by an attractive force or repulsive force of electrostatic force.

Instead of an electric driving method for the micro optical shutter and reflection device, there is a thermoelectric driving method for micro actuator plate by using an expansion and contraction of the shape alloy metal or bi-metal.

In the programmable mask, each unit device is controlled by external integrated circuit for store or erase of an input signal and an electrode material in an active area of the device can be using as a projection ITO or $SnO_2$ conductive layer. The optical projection type and optical reflection type exposure apparatus is depends on the kind of the programmable mask. The unit device size of the optical shutter or the optical reflection plate actuator is fabricated by considering a reduction ratio projected on the wafer. Moreover, instead of using the optical shutter, an array of a semiconductor laser device as a micro-luminous light source can be used for printing a micro pattern.

While fabricating the array of the optical shutter device or an electroluminescent device, a non-active border area between each device is designed narrower than an active area so that it will disappear during passing through an optical path or is not to be projected by controlling a sensitivity of photoresist layer so that it will not be patterned.

As described above, for patterning an integrated circuit on the silicon wafer, the photo-lithography technique has been using mainly and it needs a step for designing a circuit pattern, fabricating masks, and printing the pattern. This invention provides a method to inputting a circuit pattern directly into the programmable mask by an electrical input signal without a mask fabrication process and then the pattern is exposed on a photoresist coated silicon wafer. The exposure apparatus equipped with the programmable mask is expected to reduce a cost for fabricating and controlling the quartz masks, to be able to do an on-site-inspection and correction process rapidly, to do automation process easily connected with a CAD pattern information, to increase an accuracy of the pattern alignment between each masks. Also, this invention is very promising for applying to ASIC development area of a device which needs to make in small amount and many different kinds and needs many masks and also for applying to a fabrication of an accurate printed circuit board such as PCB circuit pattern as well as a fabrication of the semiconductor circuit.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A programmable mask for a stepper exposure system, the programmable mask comprising:

an exposing pattern formed by an array structure of a pixel type micro-device which has an optical shutter or optical reflector function activated by an electrical pattern information for exposure, wherein said micro-device includes an actuator placed between a transparent electrode and an opaque electrode, and selectively passes a light which can expose a photoresist according to an electrical input signal, and said actuator is driven by an electrical signal applied to said opaque electrode.

* * * * *